(12) United States Patent
Tsorng et al.

(10) Patent No.: US 11,366,500 B1
(45) Date of Patent: Jun. 21, 2022

(54) SYSTEM CHASSIS

(71) Applicant: Quanta Computer Inc., Taoyuan (TW)

(72) Inventors: Yaw-Tzorng Tsorng, Taoyuan (TW);
Tung-Hsien Wu, Taoyuan (TW);
Wei-Jie Chen, Taoyuan (TW); Wen-Jui Yu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/172,279

(22) Filed: Feb. 10, 2021

(51) Int. Cl.
*G06F 1/18* (2006.01)
*H05K 7/14* (2006.01)

(52) U.S. Cl.
CPC .............. *G06F 1/186* (2013.01); *G06F 1/181* (2013.01); *H05K 7/1487* (2013.01)

(58) Field of Classification Search
CPC .......... G06F 1/185; G06F 1/186; G06F 1/181; G06F 1/1679; G06F 13/4081; G06F 13/4022; H05K 7/1487; H05K 7/1488; H05K 1/144; H05K 1/14; H01R 24/64
USPC .................................................. 361/679.32
See application file for complete search history.

(56) References Cited

U.S. PATENT DOCUMENTS

| | | | |
|---|---|---|---|
| 6,533,587 B1* | 3/2003 | Potter ..................... | G06F 1/184 257/E23.099 |
| 7,589,978 B1* | 9/2009 | Holdredge ........... | H05K 9/0041 361/818 |
| 10,936,527 B1* | 3/2021 | Chen ....................... | G06F 1/187 361/679.31 |
| 2004/0257763 A1* | 12/2004 | Andresen ............. | H05K 7/1487 361/679.4 |
| 2006/0044774 A1* | 3/2006 | Vasavda .................. | G06F 1/184 361/796 |
| 2016/0073544 A1* | 3/2016 | Heyd ....................... | G06F 1/187 361/679.31 |
| 2019/0129882 A1* | 5/2019 | Pudipeddi ........... | G06F 13/4081 |
| 2021/0044043 A1* | 2/2021 | Young .................. | H05K 7/1444 |

OTHER PUBLICATIONS

Held, J., Li, Y., Ning, J., OCP NIC 3.0 Collaboration [PowerPoint presentation], OCP Summit, San Jose, CA, United States, Mar. 2018 [retrieved on Apr. 6, 2022]. Retrieved from the Internet: <URL: https://www.opencompute.org/files/OCP18-EngWorkShop-OCP-NIC4.0-v05-20180305-add-note.pdf> pp. 1-29. (Year: 2018).*

* cited by examiner

*Primary Examiner* — Adrian S Wilson
*Assistant Examiner* — Gage Crum
(74) *Attorney, Agent, or Firm* — Nixon Peabody LLP (57) ABSTRACT

A system chassis includes a housing and a card cage. The card cage is positioned at a first end of the housing. The card cage includes a plurality of cavities arranged to receive (i) a lower row of expansion device cards arranged in a first orientation, and (ii) an upper row of expansion device cards arranged in a second orientation, which is upside down from the first orientation.

16 Claims, 12 Drawing Sheets

SYSTEM CHASSIS

TECHNICAL FIELD

This disclosure relates generally to system chassis, and more particularly, to system chassis configured to receive expansion device cards.

BACKGROUND

Conventional servers have a standard height and a standard width. For example, a conventional 1 U server has a height of one rack unit (e.g., 44.45 mm) and a width of about 450 mm. For such a conventional 1 U server, the front or rear of its system motherboard can only receive a limited number of expansion device cards, such as a single row of up to five Open Compute Project ("OCP") 3.0 network interface controller ("NIC") expansion device cards. Thus, a need exists for maximizing the installation capacity of a system chassis that has a limited height due to its industry standard. The present disclosure is directed to solving these problems.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter; nor is it intended to be used in isolation to determine the scope of the claimed subject matter. The subject matter should be understood by reference to appropriate portions of the entire specification of this disclosure, any or all drawings and each claim.

According to some implementations of the present disclosure, a system chassis includes a housing and a card cage. The card cage is positioned at a first end of the housing. The card cage includes a plurality of cavities arranged to receive (i) a lower row of expansion device cards arranged in a first orientation, and (ii) an upper row of expansion device cards arranged in a second orientation, which is upside down from the first orientation.

In some implementations, the system chassis has a height of about 1 rack unit. In some implementations, the expansion device cards are network interface controller (NIC) cards. In some implementations, the plurality of cavities is arranged in an upper row of five cavities, and a lower row of five cavities. In some implementations, each of the expansion device cards includes a thumb screw for coupling to a stack plate of the system chassis. In some implementations, each of the expansion device cards includes an ejector latch for coupling to a stack plate of the system chassis. In some implementations, each of the expansion device cards includes an internal lock for coupling to a stack plate of the system chassis.

According to some implementations of the present disclosure, a computing system includes a system chassis and a first printed circuit board (PCB). The system chassis includes a plurality of cavities at a first end. The plurality of cavities is arranged to receive (i) a lower row of expansion device cards arranged in a first orientation, and (ii) an upper row of expansion device cards arranged in a second orientation, which is upside down from the first orientation. The first PCB is housed in a lower portion of the system chassis. The first PCB is configured to be coupled to the lower row of expansion device cards.

In some implementations, the first PCB is a motherboard of the computing system.

In some implementations, the computing system further includes a second PCB, which is housed over the first PCB of the system chassis. The second PCB is configured to be coupled to the upper row of expansion device cards. In some implementations, the computing system further includes a third PCB configured to couple to the first PCB and the second PCB, thereby allowing communication from the upper row of expansion device cards to the first PCB. In some implementations, the third PCB is housed in an end portion of the system chassis, which is opposite from the first end of the system chassis.

In some implementations, the first PCB includes a board-to-board connector, which is configured to couple to the second PCB, thereby allowing communication from the upper row of expansion device cards to the first PCB.

In some implementations, the first PCB includes at least one card cable, which is configured to couple to the upper row of expansion device cards. In some implementations, the computing system further includes at least one panel mount connector, which is coupled to the plurality of cavities. Each panel mount connector is configured to couple a corresponding expansion device card of the upper row of expansion device cards to a corresponding card cable on the first PCB.

In some implementations, the plurality of cavities is arranged in an upper row of five cavities and a lower row of five cavities.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure, and its advantages and drawings, will be better understood from the following description of exemplary embodiments together with reference to the accompanying drawings.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

The present inventions can be embodied in many different forms. Representative embodiments are shown in the drawings, and will herein be described in detail. These embodiments are examples or illustrations of the principles of the disclosure but are not intended to limit its broad aspects. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is described with reference to the attached figures, where like reference numerals are used throughout the figures to designate similar or equivalent elements. The figures are not drawn to scale and are provided merely to illustrate the instant disclosure. Several aspects of the disclosure are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Typically, a conventional 1 U server chassis has a standard height of about 44.45 mm, and can only receive one row of expansion device cards, due to the additional space the expansion device cards need for air flow and for coupling to the motherboard. For example, a conventional 1 U server chassis having a width of about 450 mm can only receive a single row of up to five OCP 3.0 NIC cards. The present disclosure relates to a system chassis that has a standard height (e.g., 1 U), but can receive at least twice as many expansion device cards as the conventional 1 U system chassis. According to some implementations of the present disclosure, a system chassis includes a plurality of cavities arranged to receive (i) a lower row of expansion device cards arranged right-side up, and (ii) an upper row of expansion device cards arranged upside down. The disclosed orientation and/or arrangement of the plurality of cavities provides the space-saving feature, which allows the system chassis to receive two rows of expansion device cards in a 1 U system chassis, while still maintaining the needed air flow and connection to the motherboard.

Figure 1:
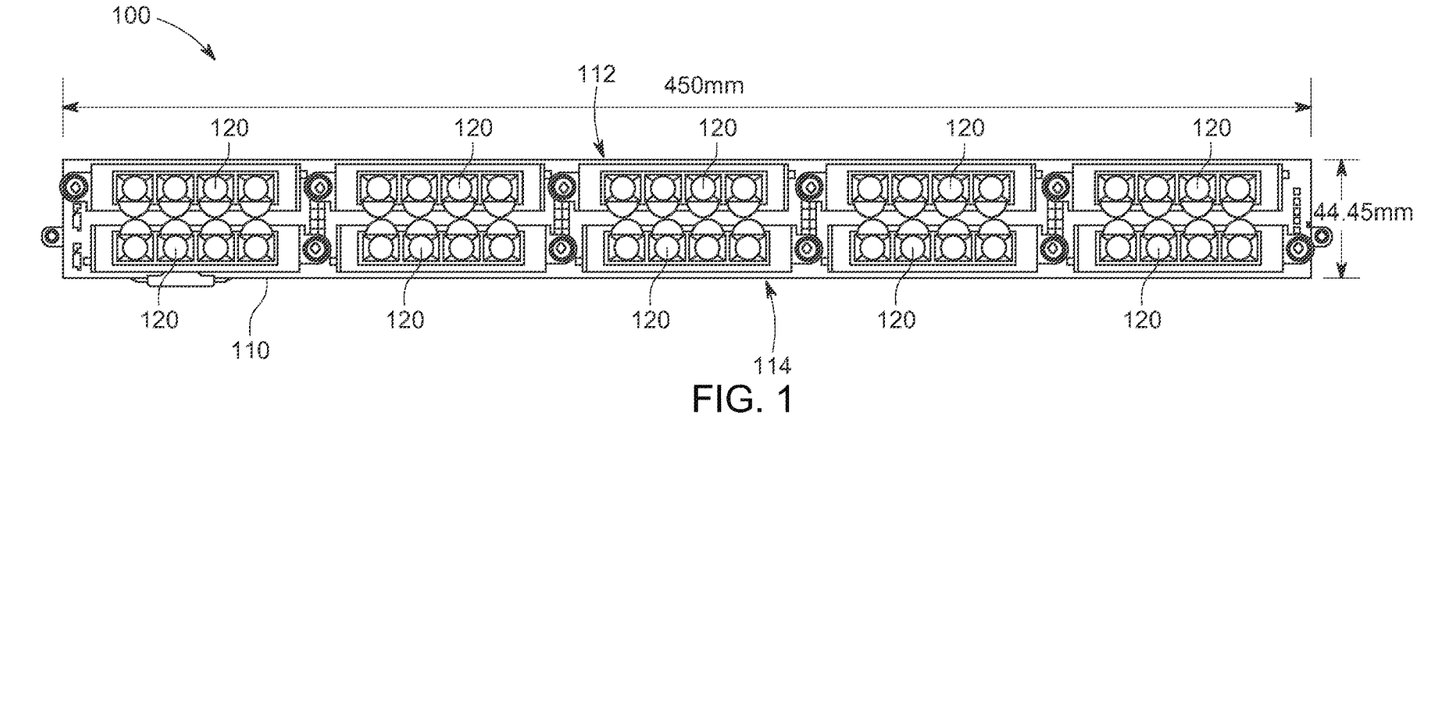
FIG. 1 depicts a computing system having a system chassis and ten expansion device cards, according to some implementations of the present disclosure.

Referring generally to FIG. 1, a computing system 100 includes an example system chassis 110 having a standard height of 1 U (i.e., 44.45 mm) and a width of about 450 mm. The system chassis 110 includes a top side 112 and an opposite bottom side 114. The system chassis 110 is configured to receive two rows of expansion device cards 120, between the top side 112 and the bottom side 114 of the system chassis 110. Other chassis having different unit sizes such as a 2 U chassis may incorporate the principles described herein to increase the number of allowable expansion device cards. Other wider or narrower chassis types may also incorporate the principles described herein to increase the number of allowable expansion device cards.

Figure 2:
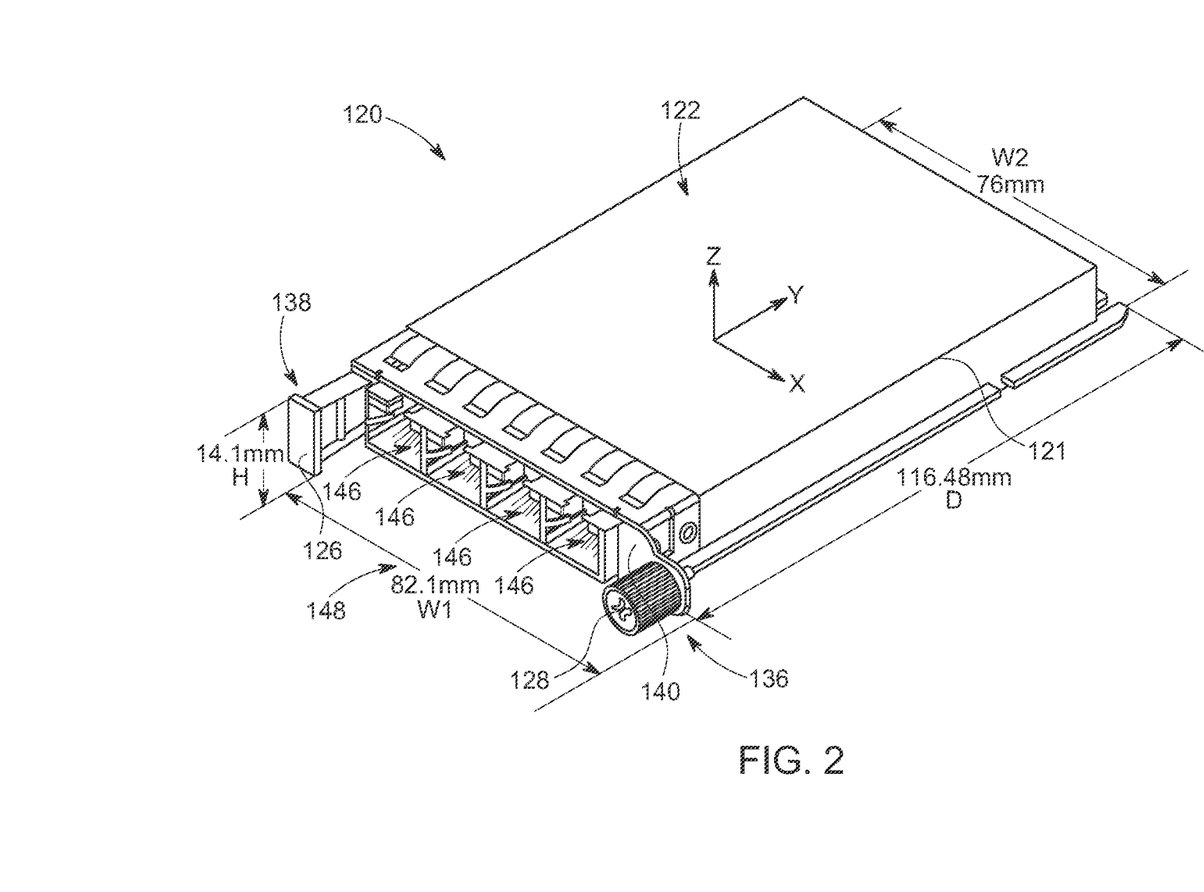
FIG. 2 depicts an expansion device card of FIG. 1, according to some implementations of the present disclosure.

As shown in FIG. 2, the expansion device card 120 received by the system chassis 110 (FIG. 1) may be an NIC card (e.g., a small form factor NIC card, or any standard OCP NIC cards). In this example, the expansion device card 120 has a front width W1 of about 82.1 mm, a rear width W2 of about 76 mm, a height H of about 14.1 mm, and a depth D of about 116.48 mm. The principles described herein may be used for expansion device cards having different dimensions and having different form factors.

Figure 4:
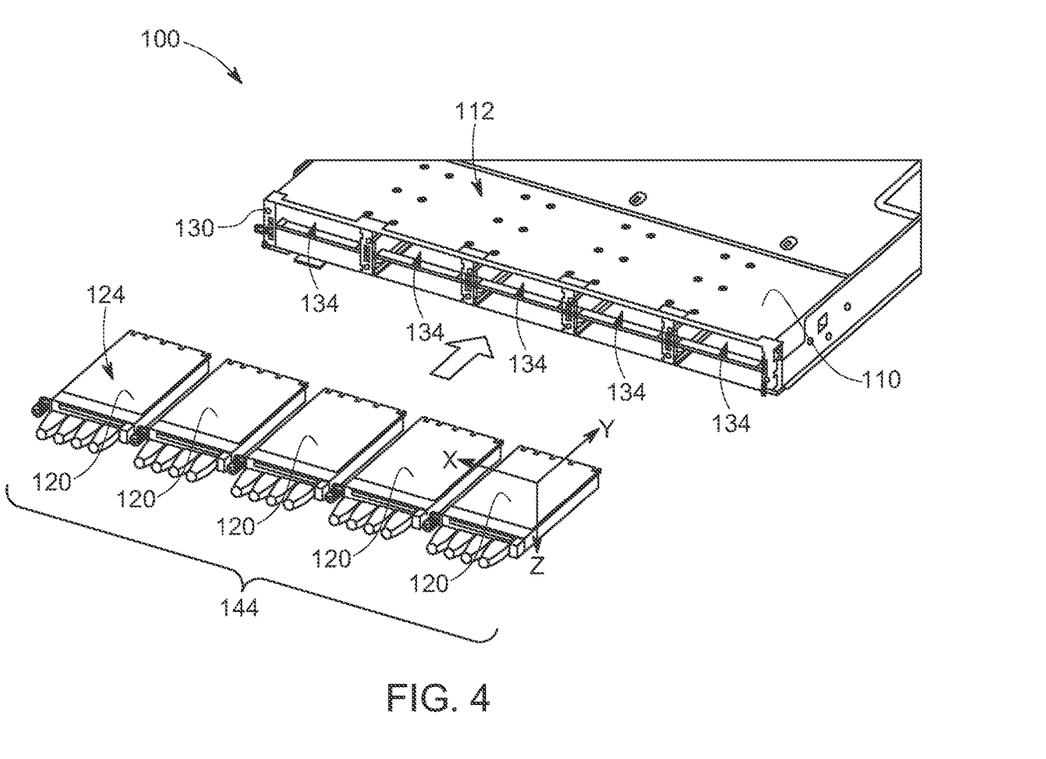
FIG. 4 depicts the system chassis of FIG. 1 receiving a second row of expansion device cards, according to some implementations of the present disclosure.

The expansion device card 120 includes a top side 122 and an opposite bottom side 124 (FIG. 4). The expansion device card 120 is configured to attach and/or otherwise connect to the motherboard through its pins at the bottom side 124 (FIG. 4). In some implementations, the expansion device card 120 includes a pull tab 126 at a first end 138, and a thumb screw 128 at an opposite end 136, across the front width W1 of the expansion device card 120. In this example, the expansion device card 120 includes four ports 146 at the front side 148 of the expansion device card 120, for connection of cables. In some implementations, the expansion device card 120 includes network interface circuitry.

A shown in FIG. 2, when positioned right-side up, the pull tab 126 is shown on the left side of the expansion device card 120, and the thumb screw 128 is shown on the right side of the expansion device card 120. The expansion device card 120 includes an attachment plate 140, to which the thumb screw 128 is attached. In some implementations, the attachment plate 140 may be integral to the housing 121 of the expansion device card 120. The thumb screw 128 of the expansion device card 120 may be used to affix the expansion device card 120 on the system chassis 110 (FIG. 1).

Figure 3:
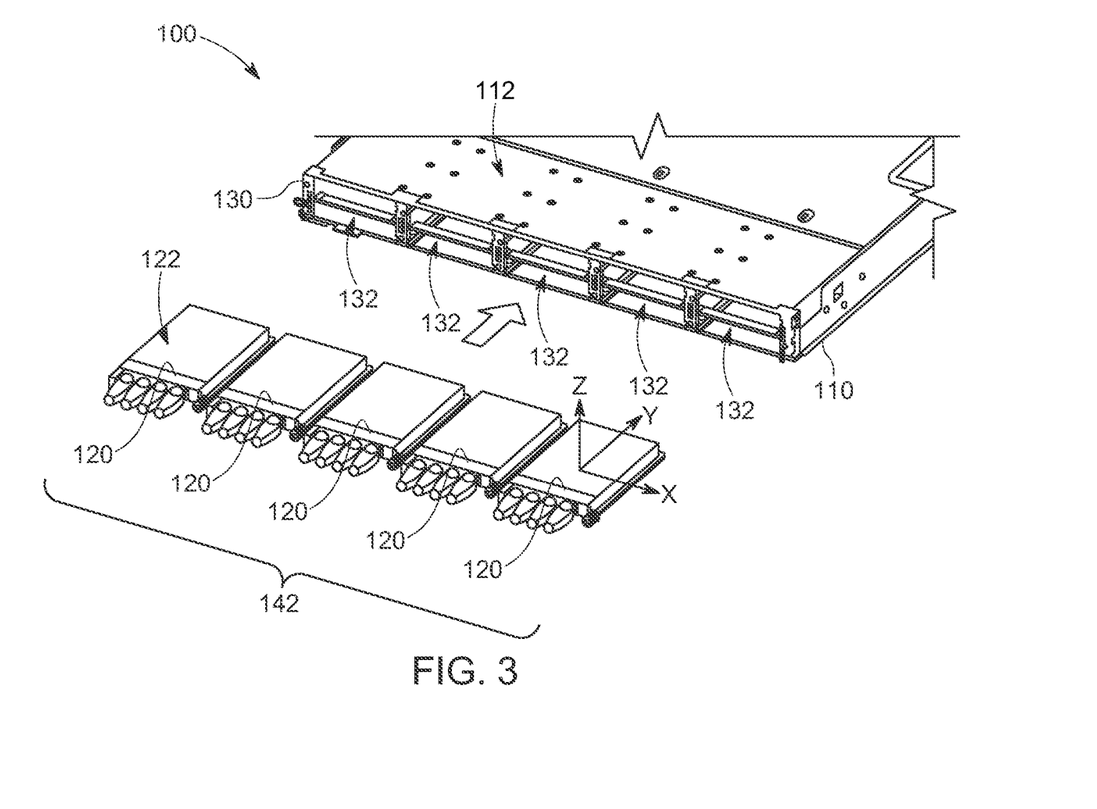
FIG. 3 depicts the system chassis of FIG. 1 receiving a first row of expansion device cards, according to some implementations of the present disclosure.

Referring generally to FIGS. 3-4, in some implementations, the computing system 100 further includes a stack plate 130 coupled to the front end and/or the rear end of the system chassis 110. The stack plate 130 includes two rows of card slots (e.g., expansion slots) 132 and 134 for receiving two rows of expansion device cards 120. For example, in some implementations, the thumb screw 128 (FIG. 2) of the expansion device card may be affixed to the stack plate 130.

As shown in FIG. 3, the stack plate 130 is configured to receive a first row 142 of five expansion device cards 120 at the lower row of card slots 132. A first row 142 of expansion device cards 120 are configured to be received right-side up in the respective lower row of card slots 132, where the top side 122 of each expansion device card 120 faces the top side 112 of the system chassis 110.

As shown in FIG. 4, the stack plate 130 is configured to receive a second row 144 of five expansion device cards 120 at the upper row of card slots 134. The second row 144 of expansion device cards 120 are configured to be received upside down, where the bottom side 124 of each expansion device card 120 faces the top side 112 of the system chassis 110. When installed, the bottom side 124 of each expansion device card 120 in the lower row of card slots 132 faces the opposite direction from the bottom side 124 of each expansion device card 120 in the upper row of card slots 134. Because each expansion device card 120 is configured to attach and/or otherwise connect to a motherboard through its pins at the bottom side 124, such opposite orientation between the two rows 142 and 144 of expansion device cards 120 allows adequate space for air flow and attachment to the motherboard.

Figure 5:
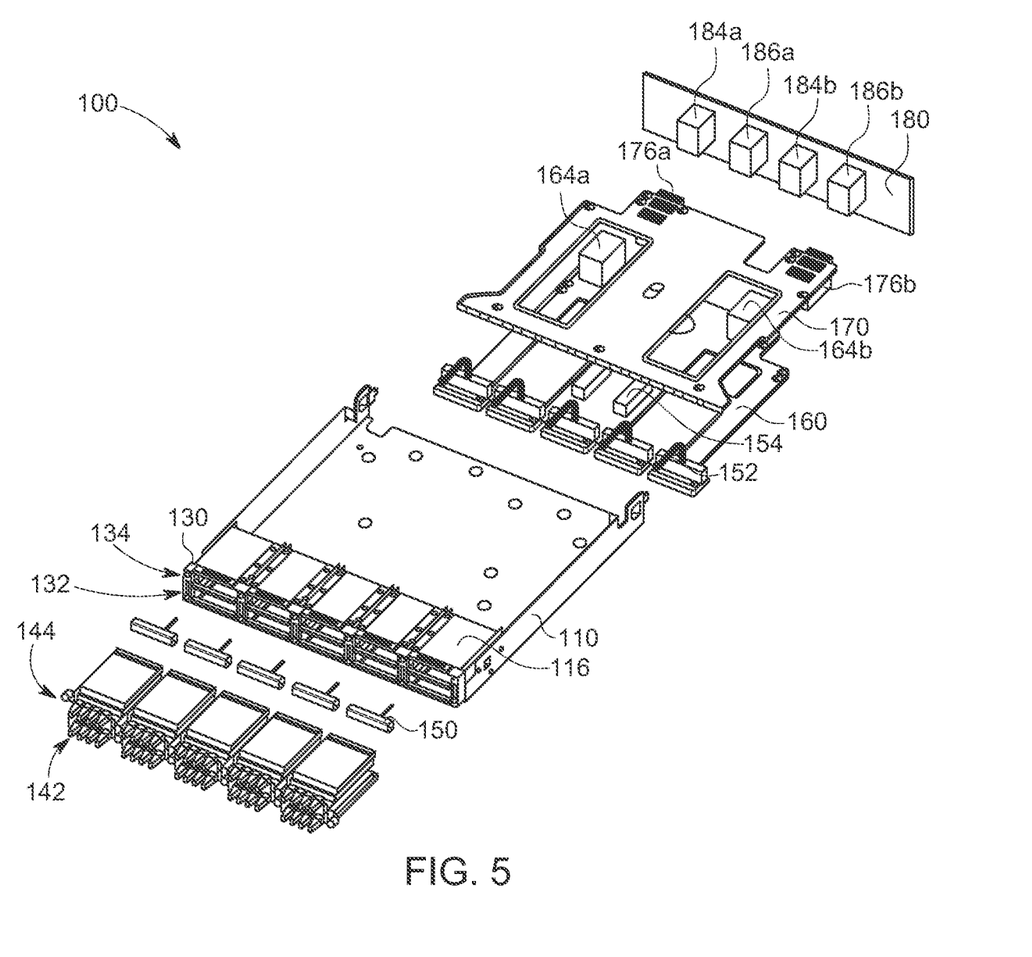
FIG. 5 depicts an exploded view of the computing system of FIG. 1, according to some implementations of the present disclosure.

Referring to FIG. 5, in some implementations, the computing system 100 may have additional components in order to utilize the two rows 142 and 144 of expansion device cards. The system chassis 110 further includes a card cage 116 coupled to the stack plate 130. The card cage 116 may be divided into ten cavities corresponding to the rows of card slots 132 and 134 of the stack plate 130. Each cavity of the card cage 116 is configured to enclose an expansion device card, such as the expansion device card 120 (FIG. 2).

The computing system 100 also includes a lower layer printed circuit board ("PCB") 160, an upper layer PCB 170, and a back PCB 180. The lower layer PCB 160 is configured to communicate with the first row 142 of expansion device cards. The upper layer PCB 170 is configured to communicate with the second row 144 of expansion device cards.

The back PCB 180 is oriented vertically and is perpendicular relative to the PCBs 160 and 170. The back PCB 180 is configured to communicate with both the lower layer PCB 160 and the upper layer PCB 170. For example, in some implementations, the back PCB 180 may have four connectors 184a, 186a, 184b, and 186a. The connectors 184a and 184b are configured to communicate with connectors 164a and 164b of the lower layer PCB 160, respectively. The connectors 186a and 186b are configured to communicate with connectors 176a and 176b of the upper layer PCB 170, respectively. In some implementations, the lower layer PCB 160 may be the motherboard of the computing system 100. In some implementations, the lower layer PCB 160 may include one or more board-to-board connectors 154 for communicating with the upper layer PCB 170.

The computing system 100 may also include one or more panel mount connectors 150. As shown, each panel mount connector 150 may be coupled to a corresponding expansion device card in the second row 144, via, for example, gold fingers of the expansion device cards. In some implementations, the computing system 100 includes one or more card cables 152 mounted on the lower layer PCB 160. For example, the card cables 152 can include cables with 16 lines, ribbon cables, or the like. An example connection mechanism using card cables 152 is illustrated in more detail in FIG. 11. When assembled with the expansion device cards, each card cable 152 contacts a corresponding panel mount connector 150. Thus, in some such implementations, the second row 144 of expansion device cards can also communicate with the lower layer PCB 160.

While the computing system 100 is shown in FIG. 5 as including all of the components described above, more or fewer components can be included in a computing system of the present disclosure. Thus, various systems for implementing the present disclosure can be formed using any portion or portions of the components shown and described herein and/or in combination with one or more other components.

Figure 6:
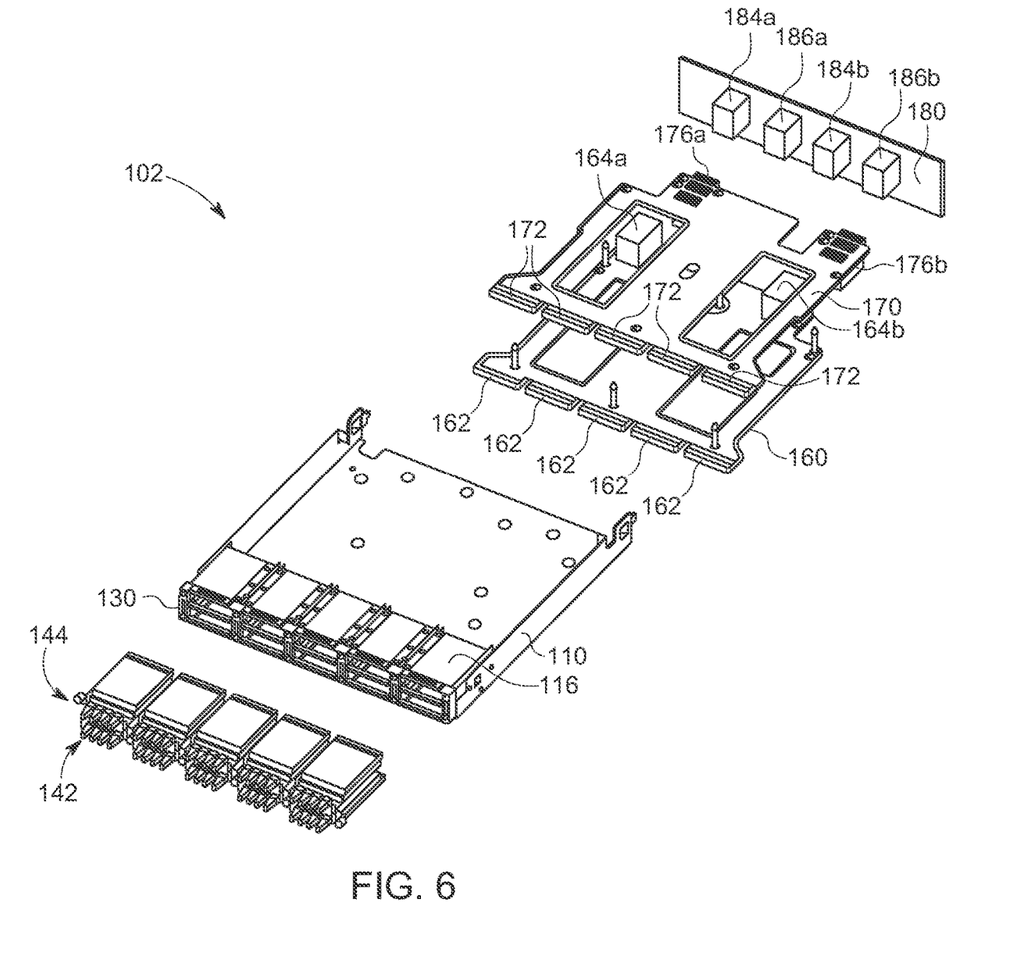
FIG. 6 depicts an exploded view of a first alternative computing system, according to some implementations of the present disclosure.

For example, referring to FIG. 6, a first alternative computing system 102 is shown. The first alternative computing system 102 is similar to the computing system 100 shown in FIG. 5, where like reference numbers refer to similar elements. The computing system 102 includes the system chassis 110, which has the card cage 116 and the stack plate 130. The system chassis 110 is configured to receive two rows 142, 144 of expansion device cards, which are at least partially enclosed within corresponding cavities of the card cage 116. The computing system 102 also includes the lower layer PCB 160, and the upper layer PCB 170. The lower layer PCB 160 and the upper layer PCB 170 can communicate with each other via the back PCB 180. Thus, in some implementations, the first alternative computing system 102 does not require cable connectors to couple the expansion device cards to the respective PCBs 160 and 170.

In some implementations, the lower layer PCB 160 includes five connectors 162. Each connector 162 is configured to connect to a corresponding expansion device card in the first row 142 of expansion device cards, such as via gold fingers. Additionally or alternatively, in some implementations, the upper layer PCB 170 includes five connectors 172. Each connector 172 is configured to connect to a corresponding expansion device card in the second row 144 of expansion device cards, such as via gold fingers.

Figure 7:
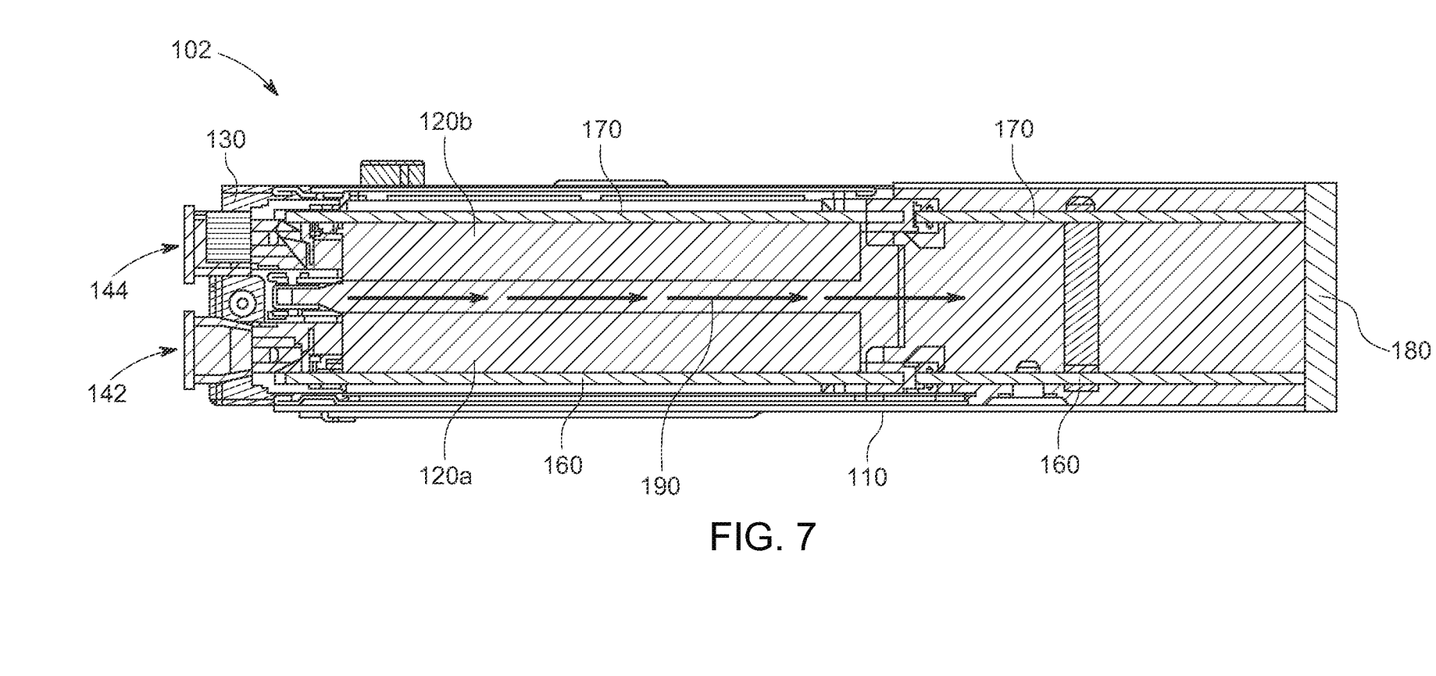
FIG. 7 depicts a cross-sectional view of the first alternative computing system of FIG. 6, according to some implementations of the present disclosure.

FIG. 7 depicts a cross-sectional view of the first alternative computing system 102. An expansion device card 120a from the first row 142 of expansion device cards is coupled to the system chassis 110 via the stack plate 130. The expansion device card 120a is installed right-side up, and is coupled to the lower layer PCB 160. An expansion device card 120b from the second row 144 of expansion device cards is coupled to the system chassis 110 via the stack plate 130. The expansion device card 120b is installed upside down, and is coupled to the upper layer PCB 170, which is communicatively coupled to the lower layer PCB 160 via the back PCB 180. As shown, in some implementations, space between the first row 142 of expansion device cards 120a and the second row 144 of expansion device cards 120b provides a path 190 for air flow.

Figure 8:
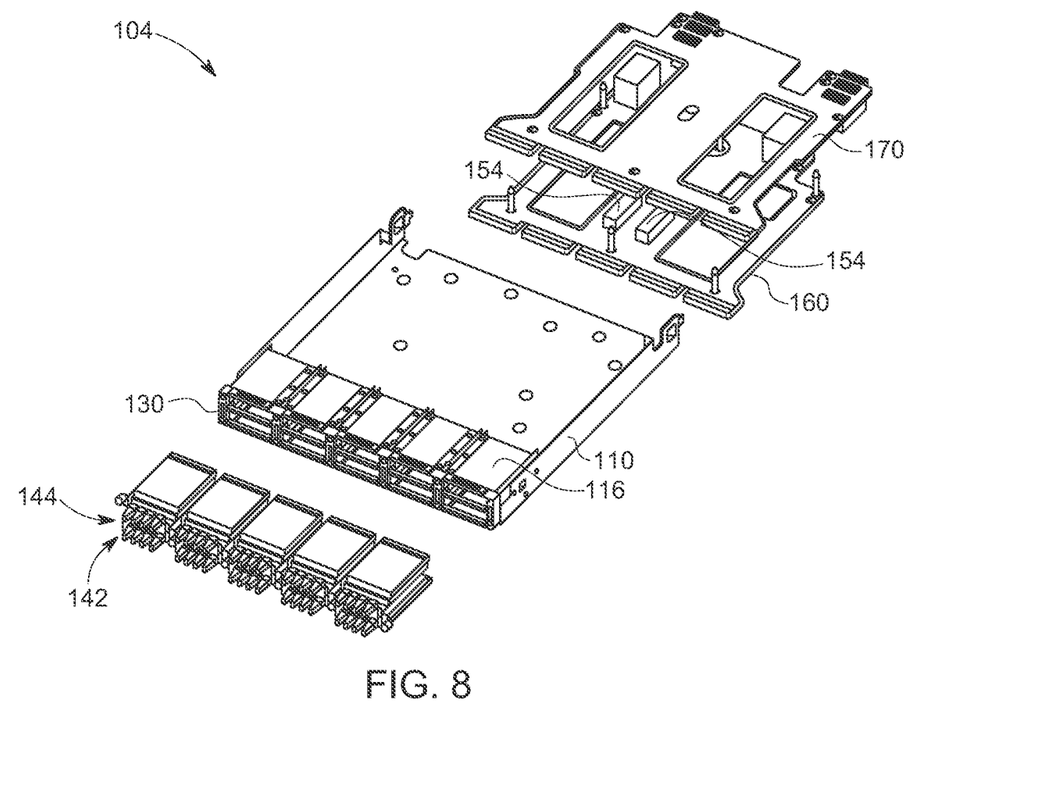
FIG. 8 depicts an exploded view of a second alternative computing system, according to some implementations of the present disclosure.

Referring to FIG. 8, as another example, a second alternative computing system 104 similar to the computing system 100 in FIG. 5 is shown. In FIG. 8, like reference numbers to FIG. 5 refer to similar elements. The computing system 104 includes the system chassis 110, which has the card cage 116 and the stack plate 130. The system chassis is 110 is configured to receive two rows 142, 144 of expansion device cards, which are at least partially enclosed within corresponding cavities of the card cage 116. The computing system 104 also includes the lower layer PCB 160, and the upper layer PCB 170. The lower layer PCB 160 and the upper layer PCB 170 can communicate with each other via board-to-board connectors 154.

Figure 9:
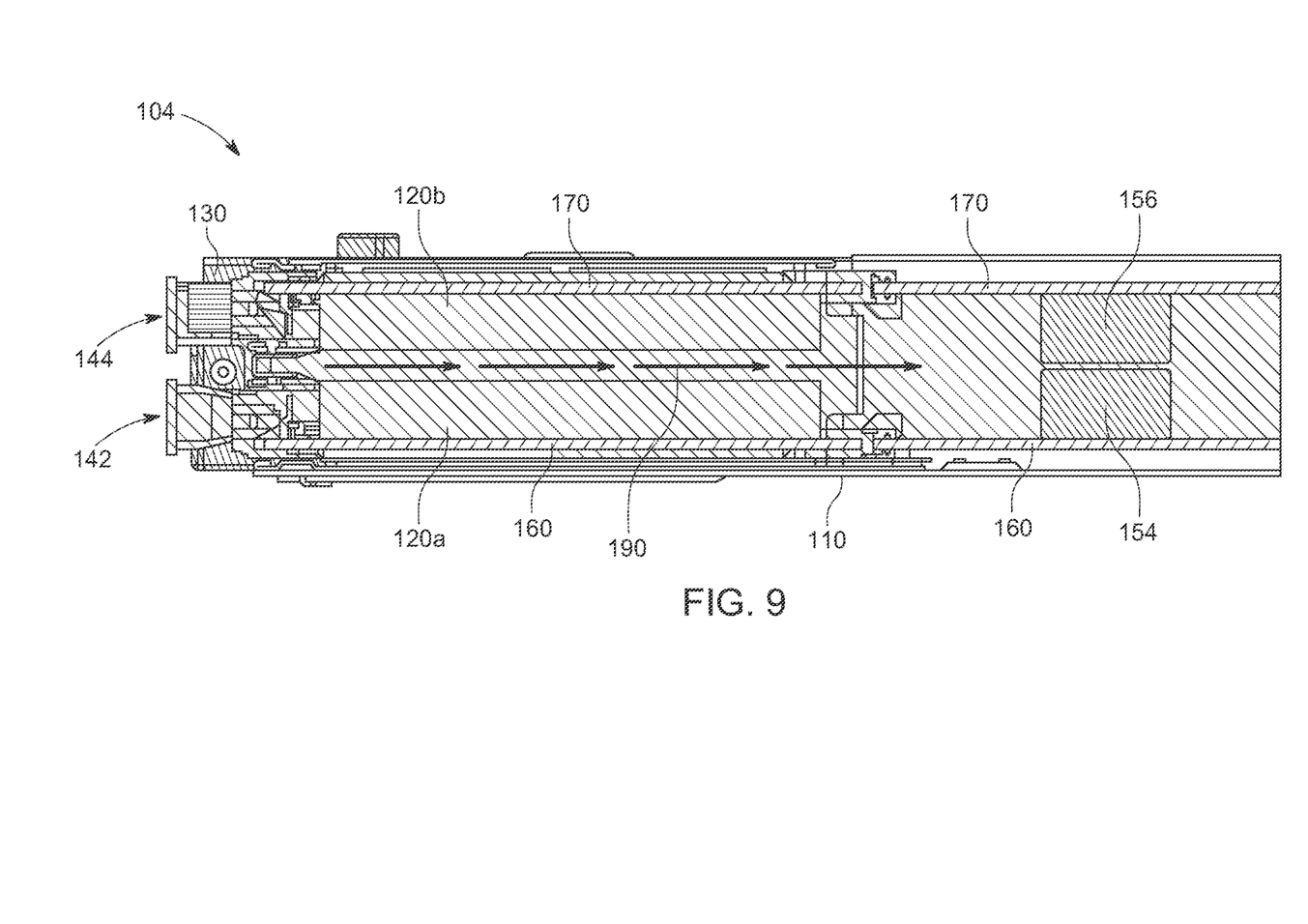
FIG. 9 depicts a cross-sectional view of the second alternative computing system of FIG. 8, according to some implementations of the present disclosure.

FIG. 9 depicts a cross-sectional view of the second alternative computing system 104. The expansion device card 120a from the first row 142 of expansion device cards is coupled to the system chassis 110 via the stack plate 130. The expansion device card 120a is installed right-side up, and is coupled to the lower layer PCB 160. The expansion device card 120b from the second row 144 of expansion device cards is coupled to the system chassis 110 via the stack plate 130. The expansion device card 120b is installed upside down, and is coupled to the upper layer PCB 170, which is communicatively coupled to the lower layer PCB 160 via at least the board-to-board connector 154. Additionally or alternatively, the upper layer PCB 170 is communicatively coupled to the lower layer PCB 160 via one or more board-to-board connectors 156 of the upper layer PCB 170. Thus, the back PCB 180 (FIGS. 5-7) is optional and/or unnecessary in the computing system 104. As shown, in some implementations, space between the first row 142 of expansion device cards 120a and the second row 144 of expansion device cards 120b provides a path 190 for air flow.

Figure 10:
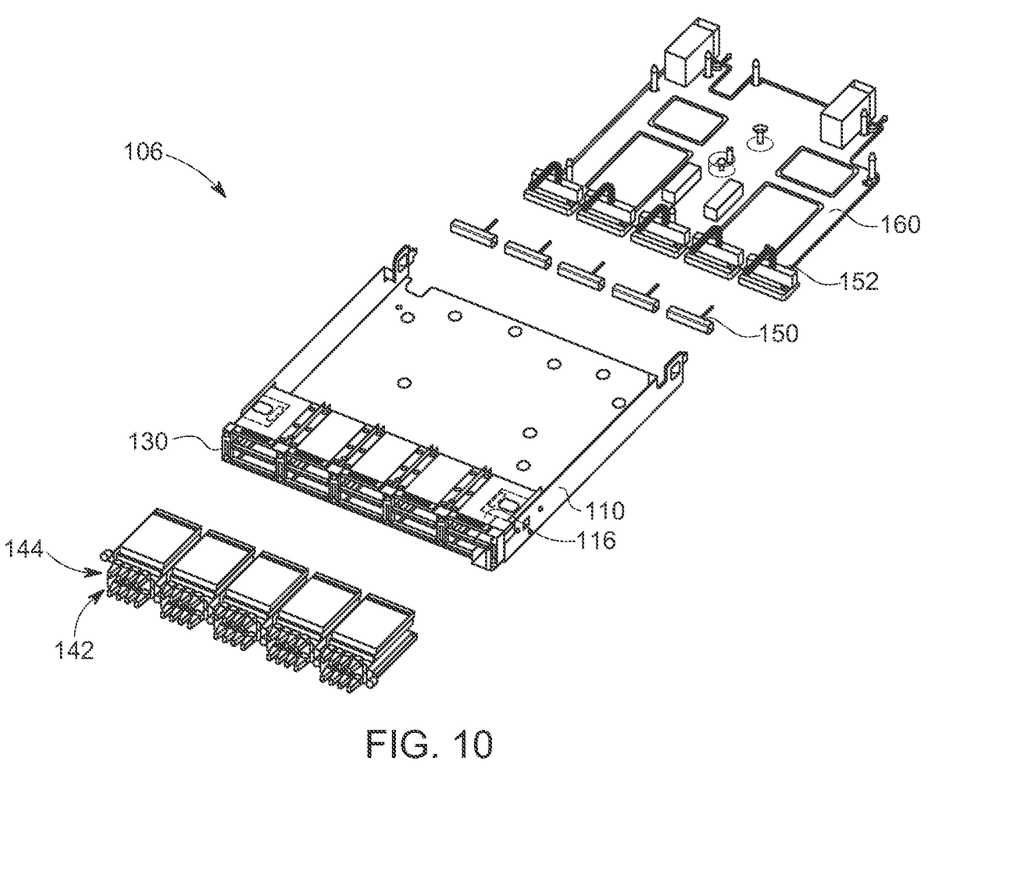
FIG. 10 depicts an exploded view of a third alternative computing system, according to some implementations of the present disclosure.

Referring to FIG. 10, as yet another example, a third alternative computing system 106 is similar to the computing system 100 in FIG. 5 is shown. Like reference numbers in FIG. 10 refer to similar elements in FIG. 5. The computing system 106 includes the system chassis 110, which has the card cage 116 and the stack plate 130. The system chassis is 110 is configured to receive two rows 142, 144 of expansion device cards, which are at least partially enclosed within corresponding cavities of the card cage 116. The computing system 106 also includes the lower layer PCB 160, which has one or more card cables 152 configured to contact corresponding panel mount connectors 150. In some implementations, the panel mount connectors 150 may be affixed to the card cage 116, on an opposite end of the card cage 116 from the stack plate 130.

Figure 11:
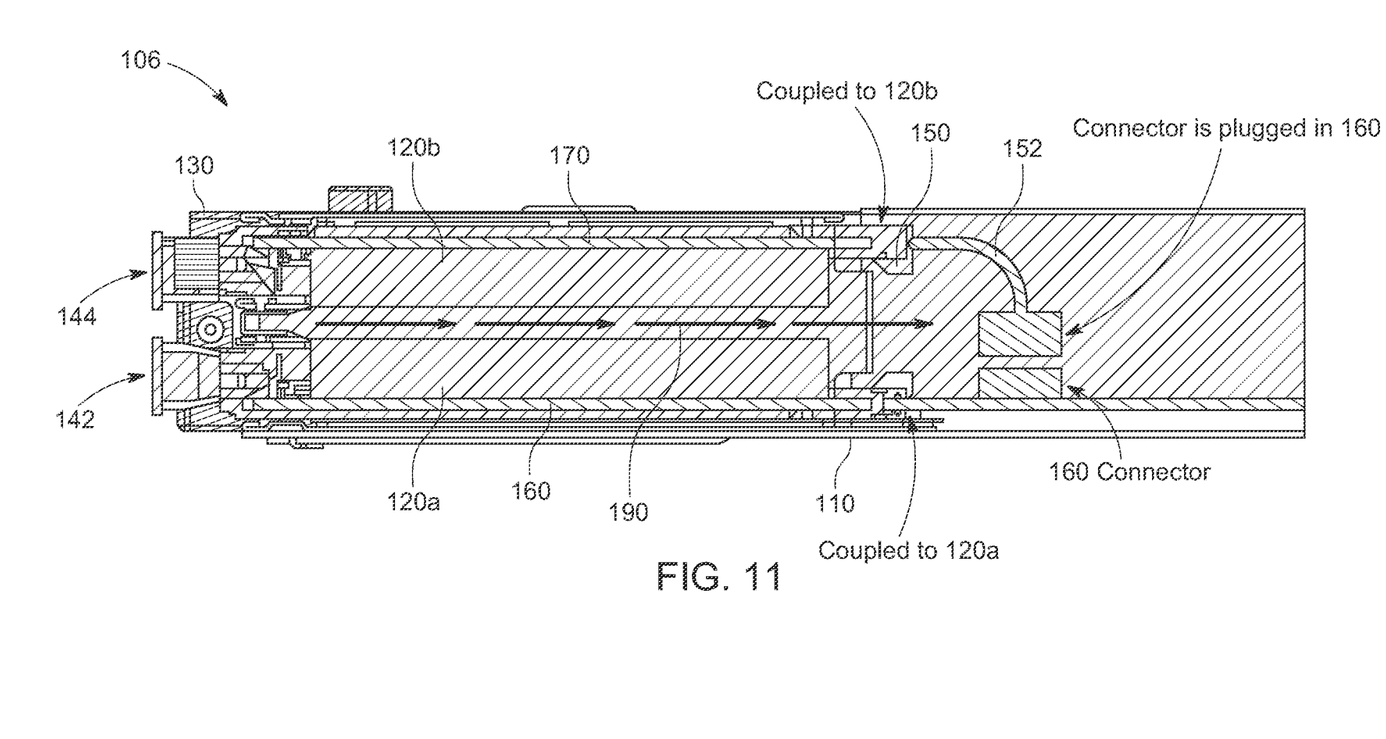
FIG. 11 depicts a cross-sectional view of the third alternative computing system of FIG. 10, according to some implementations of the present disclosure.

FIG. 11 depicts a cross-sectional view of the third alternative computing system 106. The expansion device card 120a from the first row 142 of expansion device cards is coupled to the system chassis 110 via the stack plate 130. The expansion device card 120a is installed right-side up, and is coupled to the lower layer PCB 160. For example, in some implementations, edge type connectors can be used for connecting the first row 142 of expansion device cards to the lower layer PCB 160. Additionally or alternatively, in some implementations, surface mount type connectors can be used for mating with the cables for the second row 144 of expansion device cards and the lower layer PCB 160.

The expansion device card 120b from the second row 144 of expansion device cards is coupled to the system chassis 110 via the stack plate 130. The expansion device card 120b is installed upside down, and is coupled to a panel mount connector 150, which is in turn coupled to the card cable 152 of the lower layer PCB 160. Thus, the upper layer PCB 170 (FIGS. 5-9) and the back PCB 180 (FIGS. 5-7) are optional and/or unnecessary in the computing system 106. As shown, in some implementations, space between the first row 142 of expansion device cards 120a and the second row 144 of expansion device cards 120b provides a path 190 for air flow.

Figure 12A:
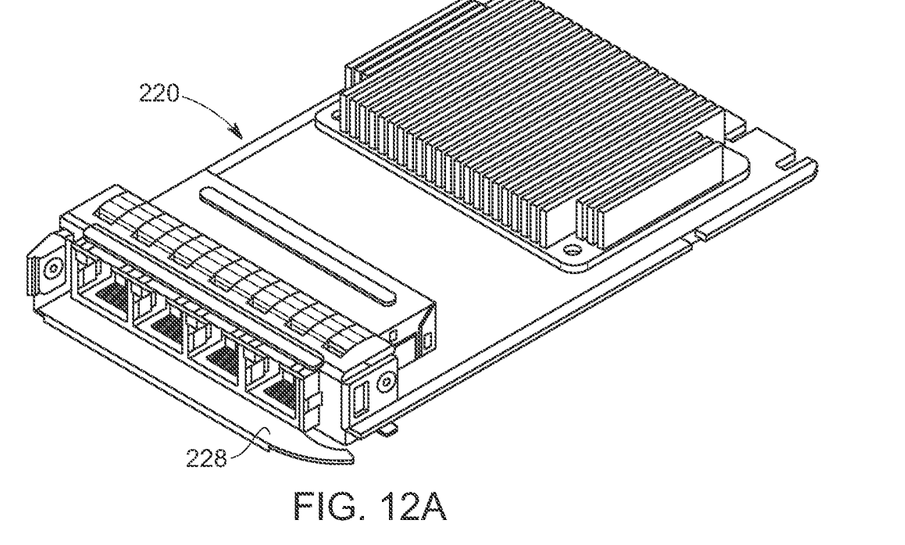
FIG. 12A depicts a first alternative expansion device card, according to some implementations of the present disclosure.
Figure 12B:
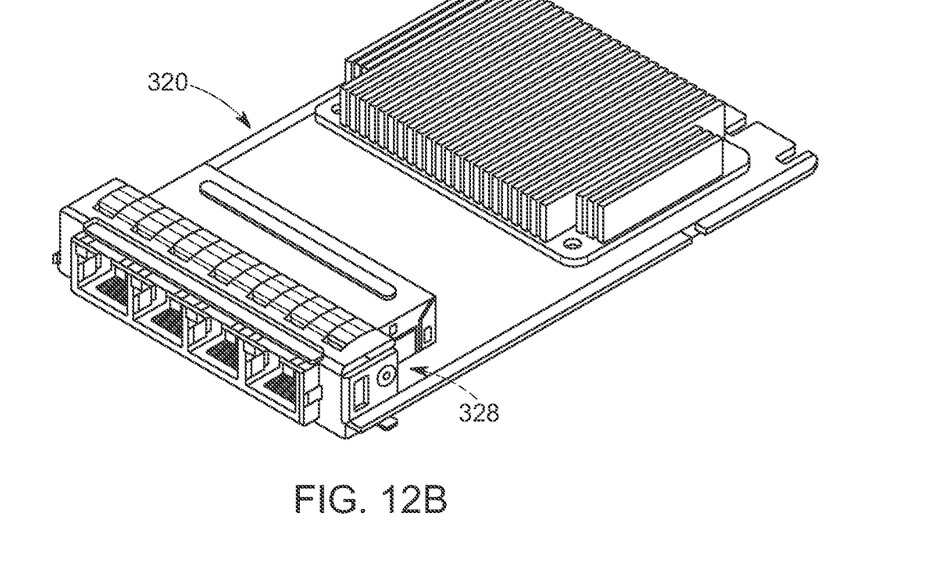
FIG. 12B depicts a second alternative expansion device card, according to some implementations of the present disclosure.

While the example computing systems are shown to receive expansion device cards 120 as shown in FIG. 2 as having a pull tab 126 and a thumb screw 128, the computing systems of the present disclosure can receive other types of expansion device cards, or a mixture of different types of expansion device cards. For example, FIG. 12A depicts a first alternative expansion device card 220, which has an ejector latch 228 for coupling to the system chassis 110 (FIG. 5). As another example, FIG. 12B depicts a second alternative expansion device card 320, which has an internal lock 328 for coupling to the system chassis 110 (FIG. 5). In some examples, dimensions of the expansion device cards 120, 220, 230 are the same, or similar to, any standard OCP NIC cards. Thus, the expansion device cards 120, 220, 230, or any other cards of similar dimensions can be installed in a system chassis (e.g., the system chassis 110) via the stack plate 130. Either of the expansion device cards 220 and 320 may be substituted for the expansion device cards 120 shown in FIGS. 1-11.

The above-described expansion device card arrangement (e.g., FIGS. 3-4) and/or PCB arrangement (e.g., FIGS. 5-11) may be built into any computing system that has any chassis that is configured to receive any expansion device cards. Such computing systems may include, for example, storage devices, network switches, communications equipment, as well as any type of server.

One or more elements or aspects or steps, or any portion(s) thereof, from one or more of any of claims 1-16 below can be combined with one or more elements or aspects or steps, or any portion(s) thereof, from one or more of any of the other claims 1-16 or combinations thereof, to form one or more additional implementations and/or claims of the present disclosure.

While various embodiments of the present disclosure have been described above, it should be understood that they have been presented by way of example only, and not limitation. Numerous changes to the disclosed examples can be made in accordance with the disclosure herein without departing from the spirit or scope of the disclosure. Thus, the breadth and scope of the present disclosure should not be limited by any of the above described examples. Rather, the scope of the disclosure should be defined in accordance with the following claims and their equivalents.

Although the disclosed embodiments have been illustrated and described with respect to one or more implementations, equivalent alterations and modifications will occur to others skilled in the art upon the reading and understanding of this specification and the annexed drawings. In addition, while a particular feature of the disclosure may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A system chassis comprising:
   a housing; and
   a card cage positioned at a first end of the housing, the card cage having a plurality of cavities arranged to receive (i) a lower row of expansion device cards arranged in a first orientation and (ii) an upper row of expansion device cards arranged in a second orientation that is upside down from the first orientation;
   wherein each of the expansion device cards includes:
      a top side;
      a bottom side that is opposite to the top side and configured to connect to a printed circuit board (PCB);
      a pull tab at a first end of the expansion device card; and
      a thumb screw at an opposite end of the expansion device card for coupling to a stack plate of the system chassis;
   wherein the plurality of cavities is arranged such that:
      the top side of a first expansion device card of the lower row of expansion device cards faces the top side of a second expansion device card of the upper row of expansion device cards; and
      the thumb screw of the second expansion device card is positioned substantially directly above the thumb screw of a third expansion device card of the lower row of expansion device cards.

2. The system chassis of claim 1, wherein the system chassis has a height of about 1 rack unit.

3. The system chassis of claim 1, wherein the expansion device cards are network interface controller (NIC) cards.

4. The system chassis of claim 1, wherein the plurality of cavities is arranged in an upper row of five cavities and a lower row of five cavities.

5. The system chassis of claim 1, wherein each of the expansion device cards includes an ejector latch for coupling to the stack plate of the system chassis.

6. The system chassis of claim 1, wherein each of the expansion device cards includes an internal lock for coupling to the stack plate of the system chassis.

7. A computing system comprising:
   a system chassis having a plurality of cavities at a first end, the plurality of cavities arranged to receive (i) a lower row of expansion device cards arranged in a first orientation and (ii) an upper row of expansion device cards arranged in a second orientation that is upside down from the first orientation;
   a first printed circuit board (PCB) housed in a lower portion of the system chassis and configured to be coupled to the lower row of expansion device cards; and
   a second PCB housed above the first PCB of the system chassis and configured to be coupled to the upper row of expansion device cards;
   wherein each of the expansion device cards includes:
      a top side;
      a bottom side that is opposite to the top side and configured to connect to either the first PCB or the second PCB; and
      a thumb screw for coupling to a stack plate of the system chassis;
   wherein the plurality of cavities is arranged such that:
      the top side of a first expansion device card of the lower row of expansion device cards faces the top side of a second expansion device card of the upper row of expansion device cards; and
      the thumb screw of the second expansion device card is positioned substantially directly above the thumb screw of a third expansion device card of the lower row of expansion device cards.

8. The computing system of claim 7, wherein the first PCB is a motherboard of the computing system.

9. The computing system of claim 7, further comprising a third PCB configured to couple to the first PCB and the second PCB, thereby allowing communication from the upper row of expansion device cards to the first PCB.

10. The computing system of claim 9, wherein the third PCB is housed in an end portion of the system chassis opposite from the first end of the system chassis.

11. The computing system of claim 7, wherein the first PCB includes a board-to-board connector configured to couple to the second PCB, thereby allowing communication from the upper row of expansion device cards to the first PCB.

12. The computing system of claim 7, wherein the first PCB includes at least one card cable configured to couple to the upper row of expansion device cards.

13. The computing system of claim 12, further comprising at least one panel mount connector coupled to the plurality of cavities, each panel mount connector being configured to couple a corresponding expansion device card of the upper row of expansion device cards to a corresponding card cable on the first PCB.

14. The computing system of claim 7, wherein the plurality of cavities is arranged in an upper row of five cavities and a lower row of five cavities.

15. The computing system of claim 9, wherein the third PCB includes:
   a first connector configured to communicate with a first corresponding connector of the first PCB, and
   a second connector configured to communicate with a second corresponding connector of the second PCB.

16. The computing system of claim 7, wherein the first PCB includes a first connector on a connector side of the first PCB for communicating with the second PCB, wherein the second PCB includes a second connector on a connector side of the second PCB for communicating with the first PCB, and wherein the connector side of the first PCB faces the connector side of the second PCB.

* * * * *